(12) United States Patent
Wang et al.

(10) Patent No.: US 11,008,669 B2
(45) Date of Patent: May 18, 2021

(54) APPARATUS FOR HOLDING A SUBSTRATE

(71) Applicant: ACM Research (Shanghai) Inc., Shanghai (CN)

(72) Inventors: Hui Wang, Shanghai (CN); Zhaowei Jia, Shanghai (CN); Hongchao Yang, Shanghai (CN); Jun Wu, Shanghai (CN); Jian Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 238 days.

(21) Appl. No.: 15/781,410

(22) PCT Filed: Dec. 4, 2015

(86) PCT No.: PCT/CN2015/096402
§ 371 (c)(1),
(2) Date: Jun. 4, 2018

(87) PCT Pub. No.: WO2017/092029
PCT Pub. Date: Jun. 8, 2017

(65) Prior Publication Data
US 2018/0320285 A1 Nov. 8, 2018

(51) Int. Cl.
*C25D 17/06* (2006.01)
*C25D 17/00* (2006.01)
(Continued)

(52) U.S. Cl.
CPC .......... *C25D 17/06* (2013.01); *C25D 17/001* (2013.01); *C25D 17/004* (2013.01);
(Continued)

(58) Field of Classification Search
CPC .. C25D 17/001; C25D 17/004; C25D 17/005; C25D 17/06–08; H01L 21/2885
See application file for complete search history.

(56) References Cited

U.S. PATENT DOCUMENTS 6,423,636 B1 * 7/2002 Dordi ................... C25D 17/001
438/678
6,579,430 B2 6/2003 Davis et al.
(Continued)

FOREIGN PATENT DOCUMENTS

| CN | 1714177 A | 12/2005 |
|---|---|---|
| CN | 101798698 A | 8/2010 |

(Continued)

OTHER PUBLICATIONS

International Search Report issued in PCT/CN2015/096402 dated Aug. 18, 2016 (2 pages).

(Continued)

*Primary Examiner* — Alexander W Keeling
(74) *Attorney, Agent, or Firm* — Osha Bergman Watanabe & Burton LLP

(57) ABSTRACT

An apparatus for holding a substrate (113) has a chuck cup (101), a seal shell (111), a chuck plate (102) and a vertical driving device (103). The seal shell (111) has a bottom wall (1111), an outer wall (1112) and an inner wall (1114). The inner wall (1114) forms a lip seal portion (1115). The bottom wall (1111) and the outer wall (1112) of the seal shell (111) respectively wrap the bottom surface and the outer surface of the base portion (1011) of the chuck cup (101). The lip seal portion (1115) wraps the supporting portion (1014) of the chuck cup (101) for sealing the edge of the front side of the substrate (113). The apparatus protects the edge of the front side of the substrate, the back side of the substrate and the chuck cup from contacting with the electrolyte solution.

20 Claims, 17 Drawing Sheets

(51) Int. Cl.
*H01L 21/288* (2006.01)
*C25D 21/08* (2006.01)

(52) U.S. Cl.
CPC ........... *C25D 17/005* (2013.01); *C25D 21/08* (2013.01); *H01L 21/2885* (2013.01)

(56) References Cited

U.S. PATENT DOCUMENTS

| | | | |
|---|---|---|---|
| 7,025,862 B2 | 4/2006 | Herchen et al. | |
| 7,935,231 B2 | 5/2011 | Ghongadi et al. | |
| 8,172,992 B2 | 5/2012 | Prabhakar et al. | |
| 2003/0019741 A1* | 1/2003 | Kholodenko | C25D 7/12 204/224 R |
| 2005/0218003 A1* | 10/2005 | Wang | H01L 21/6838 205/157 |
| 2007/0137679 A1* | 6/2007 | Rye | C25D 17/001 134/94.1 |
| 2009/0095634 A1* | 4/2009 | Makino | C25D 21/12 205/223 |
| 2009/0107836 A1* | 4/2009 | Rash | C25D 17/001 204/297.01 |
| 2013/0042454 A1 | 2/2013 | Feng et al. | |
| 2013/0306465 A1* | 11/2013 | Zimmerman | F16J 15/00 204/242 |
| 2017/0009369 A1* | 1/2017 | Berke | C25D 17/08 |

FOREIGN PATENT DOCUMENTS

| | | |
|---|---|---|
| CN | 102953104 A | 3/2013 |
| JP | 2003-313697 A | 11/2003 |
| JP | 3940648 B2 | 7/2007 |

OTHER PUBLICATIONS

Written Opinion of the International Searching Authority issued in PCT/CN2015/096402 dated Aug. 18, 2016 (3 pages).

Office Action issued in corresponding Chinese Application No. 201580085077 dated Mar. 1, 2019, and English translation of the search report (9 pages).

* cited by examiner

Hydrophobic, Φ >90°

APPARATUS FOR HOLDING A SUBSTRATE

FIELD OF THE INVENTION

The present invention generally relates to an apparatus for holding a substrate, and more particularly to an apparatus having a seal shell which wraps a chuck cup for protecting the chuck cup and an edge and a back side of the substrate when the substrate is held by the apparatus and processed in a chemical solution, such as immersed into an electrolyte solution for plating.

BACKGROUND

A metal plating/deposition process is now becoming more and more popular in IC manufacturing. Besides copper interconnection in backend of line, in the field of advanced wafer level packaging, many technologies such as Cu pillar, RDL (redistribution layer), TSV and interposer also use the metal plating process. Due to high plating rate, electrochemical plating is mainly used for those processes mentioned above.

For a plating apparatus, especially for an electrochemical plating apparatus, an apparatus for holding a substrate is very important. A contact ring of the apparatus should be uniformly contact with a seed layer on a front side of the substrate. Meanwhile, the contact ring should not be contacted with electrolyte solution directly, so a seal ring is used for the isolation and the electrolyte solution doesn't get to the edge of the front side of the substrate. Otherwise, the edge of the front side of the substrate will be plated with metal, and the uniformity of the metal film deposited on the substrate will become worse.

U.S. Pat. No. 8,172,992 B2 discloses a clamshell used for the metal deposition process. A base plate of the clamshell, including a lipseal is made of a stiff, corrosive resistant material with a hydrophobic coating, such as polyamide-imide (PAI) and polytetrafluoroethylene (PTFE). But the thickness of the coating material is very limited, and normally the thickness is several microns. Therefore after long time use, during the frequent movement of the open and close the clamshell, the coating material will be damaged due to friction with the substrate and the seal effect becomes worse. The whole clamshell needs to be replaced with a new one. The life time of the clamshell is short. And the cost is very high by frequent replacing the clamshell. So new inventions are needed to reduce the cost for mass production.

SUMMARY

Accordingly, an object of the present invention is to provide an apparatus for holding a substrate. The apparatus has a chuck cup, a seal shell, a chuck plate and a vertical driving device. The chuck cup has a base portion. The base portion has a bottom surface, an outer surface and an inner surface. The inner surface at a lower end of the base portion protrudes obliquely upward to form a supporting portion for supporting an edge of a front side of a substrate. The seal shell has a bottom wall, an outer wall and an inner wall. The inner wall forms a lip seal portion. The bottom wall and the outer wall of the seal shell respectively wrap the bottom surface and the outer surface of the base portion of the chuck cup. The lip seal portion wraps the supporting portion of the chuck cup for sealing the edge of the front side of the substrate. The vertical driving device connects to the chuck plate and drives the chuck plate to go down or up, which makes the chuck plate press against a back side of the substrate for chucking the substrate on the lip seal portion of the seal shell or leave from the back side of the substrate.

As described above, the apparatus of the present invention utilizes the seal shell wrapping the chuck cup, when the apparatus is used for holding the substrate and immersing the substrate into an electrolyte solution for plating, the seal shell protects the edge of the front side of the substrate, the back side of the substrate and the chuck cup, avoiding the edge of the front side of the substrate, the back side of the substrate and the chuck cup contacting with the electrolyte solution. The seal shell is soft, and the chuck cup is made of a material with higher degree of hardness than the seal shell, when the seal shell wraps the chuck cup, the chuck cup does not deform. Therefore, after chucking the substrate, the seal shell seals the substrate surface very gently without damage to the substrate surface. The seal effect of the seal shell is very good. Besides, the thickness of the seal shell is thick, so the life time of the seal shell is long. Moreover, after the apparatus is used for a period of time, it just needs to replace the seal shell not the whole chuck cup, which reduces the production cost.

DETAILED DESCRIPTION

Figure 1:
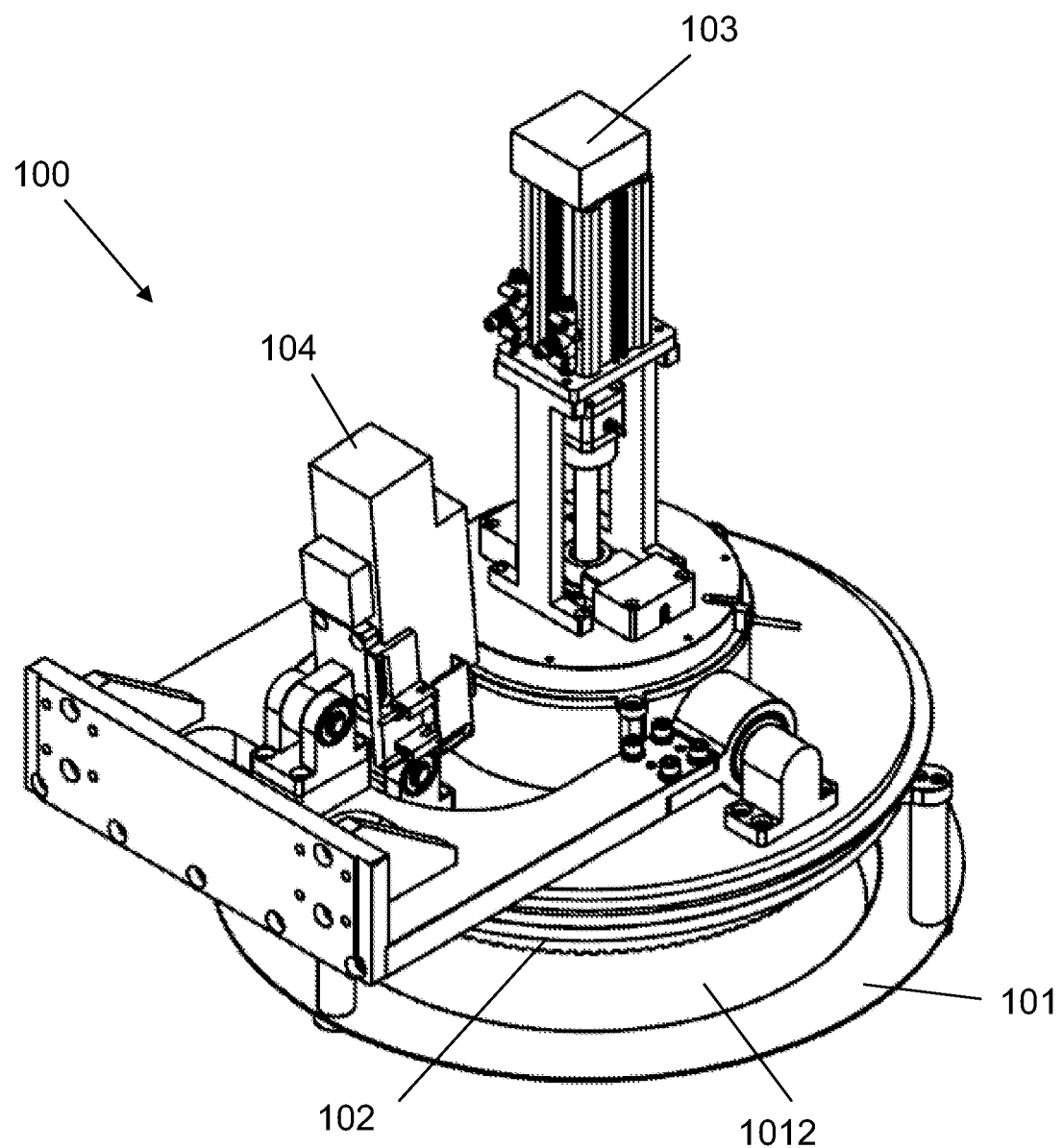
FIG. 1 is a perspective view of an apparatus for holding a substrate according to the present invention.
Figure 2:
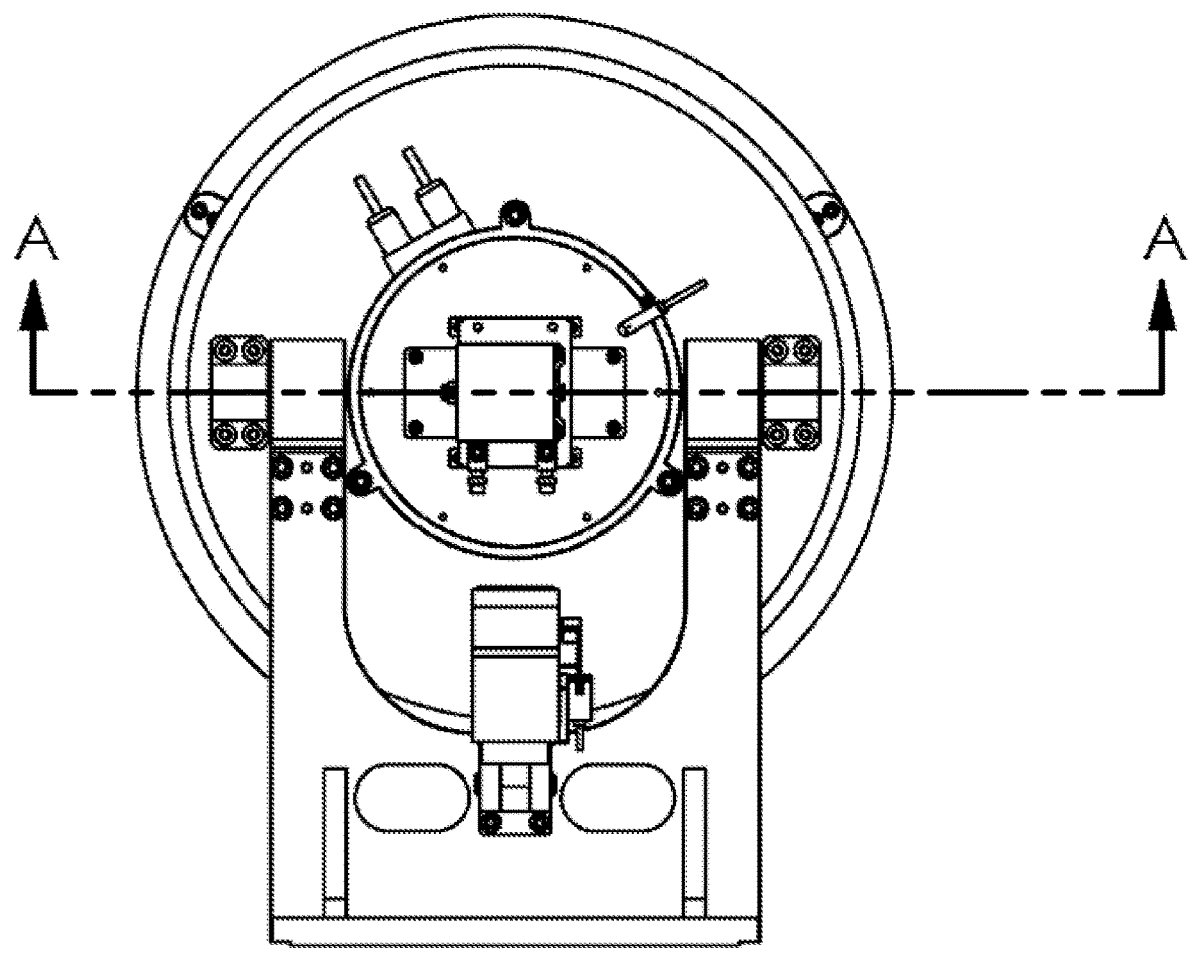
FIG. 2 is a top view of the apparatus which holds a substrate.
Figure 3:
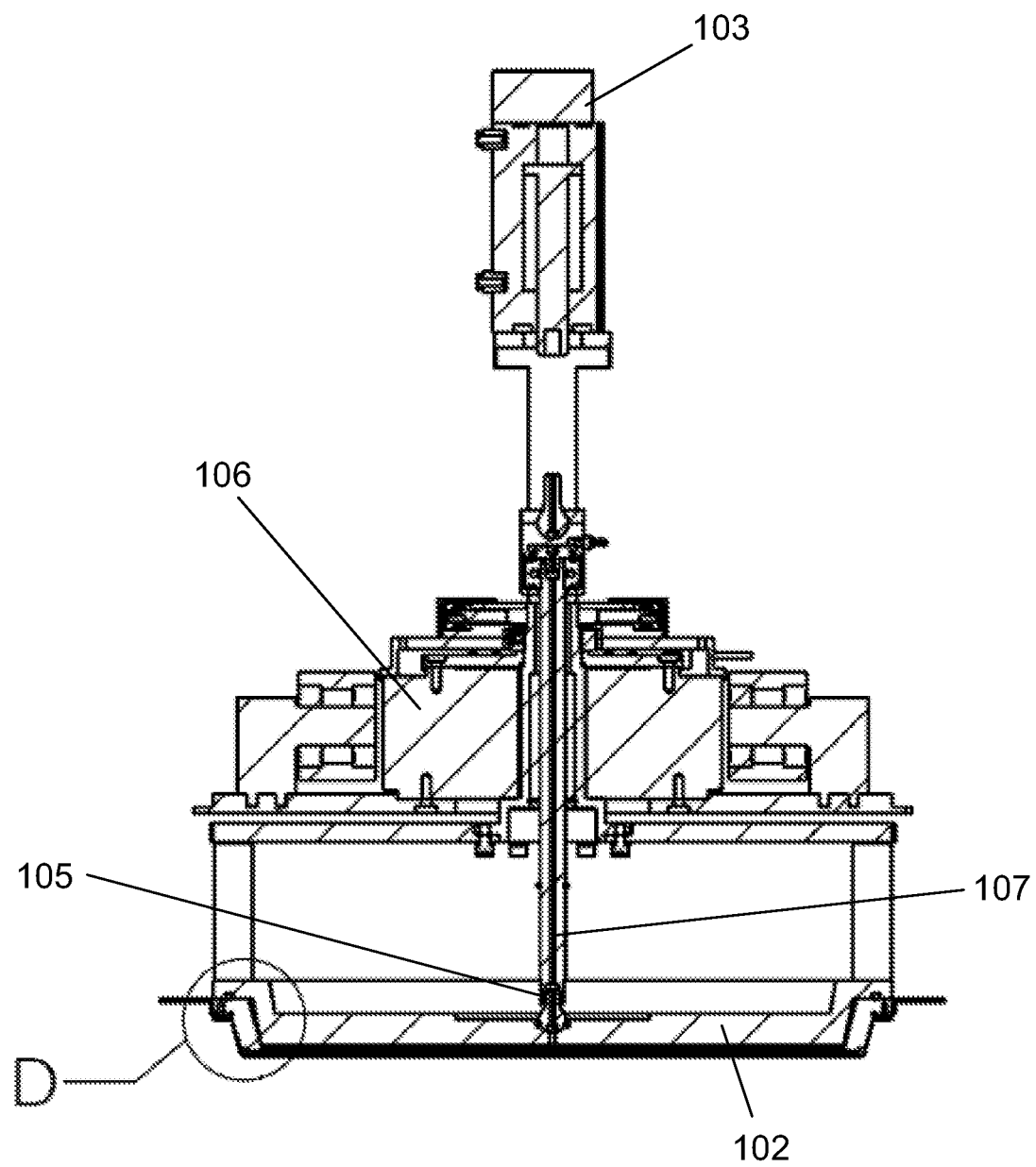
FIG. 3 is a cross-sectional view taken along line A-A of FIG. 2.

The present invention provides an apparatus for holding a substrate when the substrate is processed, such as, immersed into an electrolyte solution for plating. When the substrate is immersed into the electrolyte solution for plating a metal layer on a front side of the substrate, an edge of the front side of the substrate and a back side of the substrate should be protected and avoid contacting with the electrolyte solution. Therefore, it is different from existing technologies, the apparatus of the present invention utilizes a seal shell to prevent the electrolyte solution from getting to the edge of the front side of the substrate and the back side of the substrate when the substrate is immersed into the electrolyte solution for plating, and the seal shell is replaceable.

Referring to FIG. 1 to FIG. 6, the apparatus 100 for holding a substrate of the present invention is illustrated. The apparatus 100 has a chuck cup 101 and a chuck plate 102. The chuck cup 101 has a cup-shaped base portion 1011. The base portion 1011 confines a pass-through receiving space 1012. The base portion 1011 has a bottom surface, an outer surface and an inner surface. The inner surface of the base portion 1011 is inclined, which is beneficial to load the substrate 113. An upper end of the base portion 1011 extends outward to form a brim 1013. The inner surface at a lower end of the base portion 1011 protrudes obliquely upward to form a supporting portion 1014 for supporting the substrate 113 when the substrate 113 is put in the receiving space 1012. A groove 1015 is formed at the lower end of the base portion 1011. The chuck cup 101 is made of metal or carbon fiber, such as stainless steel, Ti, Ta, Al alloy, etc.

The chuck plate 102 connects to a vertical driving device 103 through a universal shaft 105. The vertical driving device 103 drives the chuck plate 102 to go up or down. When the substrate 113 is loaded into the receiving space 1012 and supported by the supporting portion 1014, the vertical driving device 103 drives the chuck plate 102 to go down and press against the back side of the substrate 113, so the substrate 113 is chucked by the chuck cup 101 and the chuck plate 102. The front side of the substrate 113 is exposed to process. After the process is completed, the vertical driving device 103 drives the chuck plate 102 to go up and the chuck plate 102 leaves from the back side of the substrate 113. Then the substrate 113 is taken out of the receiving space 1012. The vertical driving device 103 can be a cylinder or a motor. The surface of the chuck plate 102 which contacts with the back side of the substrate 113 defines a plurality of slots 1021. When the chuck plate 102 leaves from the back side of the substrate 113, the air easily enters the space between the chuck plate 102 and the back side of the substrate 113 from the slots 1021, which makes the substrate 113 easily break away from the chuck plate 102. For making the substrate 113 easily break away from the chuck plate 102, $N_2$ gas can also be supplied to the back side of the substrate 113 through a gas pipe 107 which is disposed in the universal shaft 105. The chuck plate 102 is made of PP, PVDF, PEEK, PET or the like.

An o-ring 108 is disposed between the chuck plate 102 and the chuck cup 101 for buffering when the chuck plate 102 is driven to go down for chucking the substrate 113. Besides, the o-ring 108 can prevent the electrolyte solution from entering the receiving space 1012 when the substrate 113 is immersed into the electrolyte solution for plating. For meeting different process requirements, the apparatus 100 has an angle control driving device 104 and a rotating driving device 106. The angle control driving device 104 drives the chuck plate 102 and the chuck cup 101 to tilt an angle when the chuck plate 102 and the chuck cup 101 fix the substrate 113 for process. The rotating driving device 106 drives the chuck plate 102 and the chuck cup 101 to rotate when the chuck plate 102 and the chuck cup 101 fix the substrate 113 for process.

Figure 4:
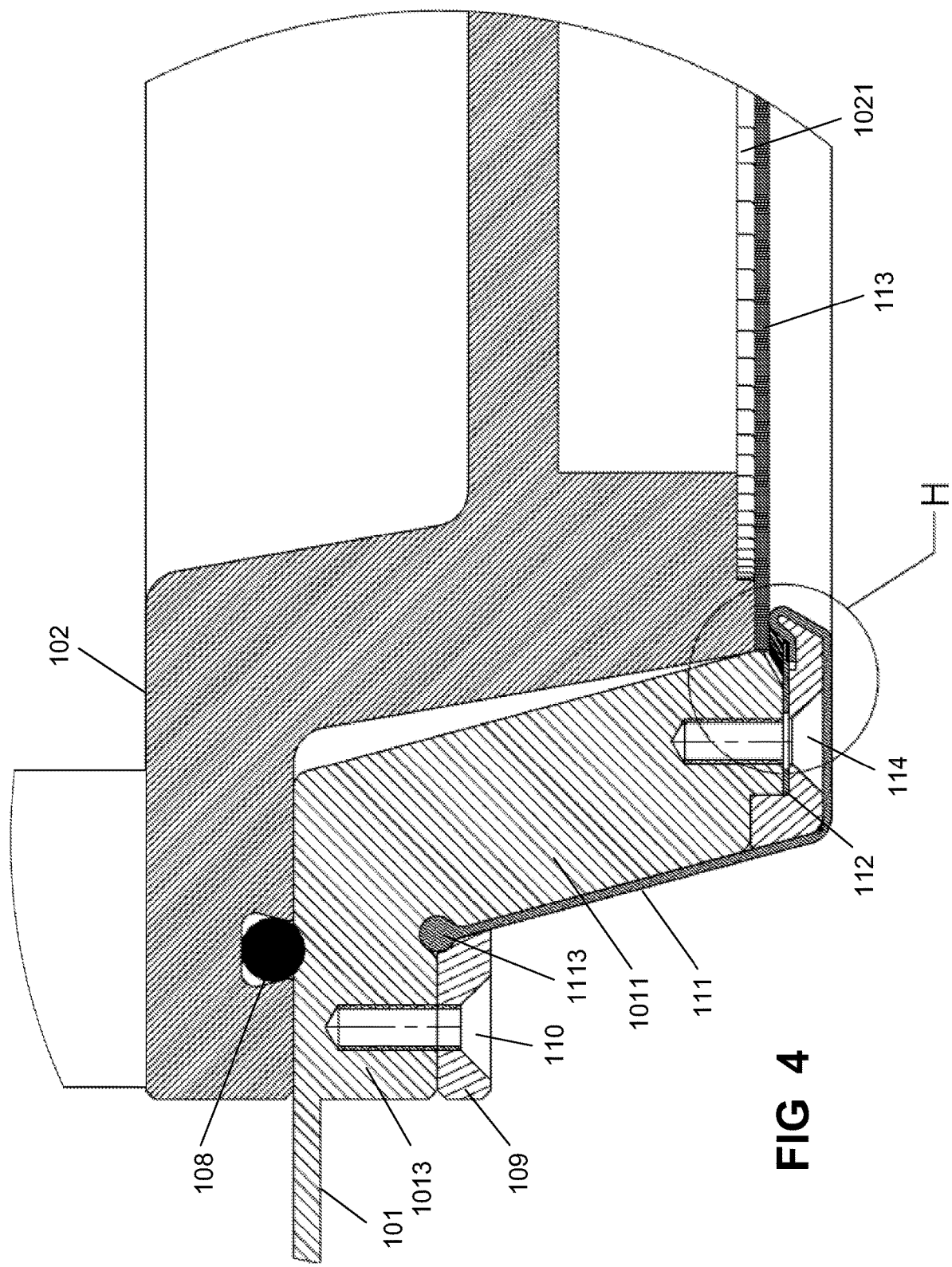
FIG. 4 is a partial enlarged view of a portion D encircled in FIG. 3.
Figure 5:
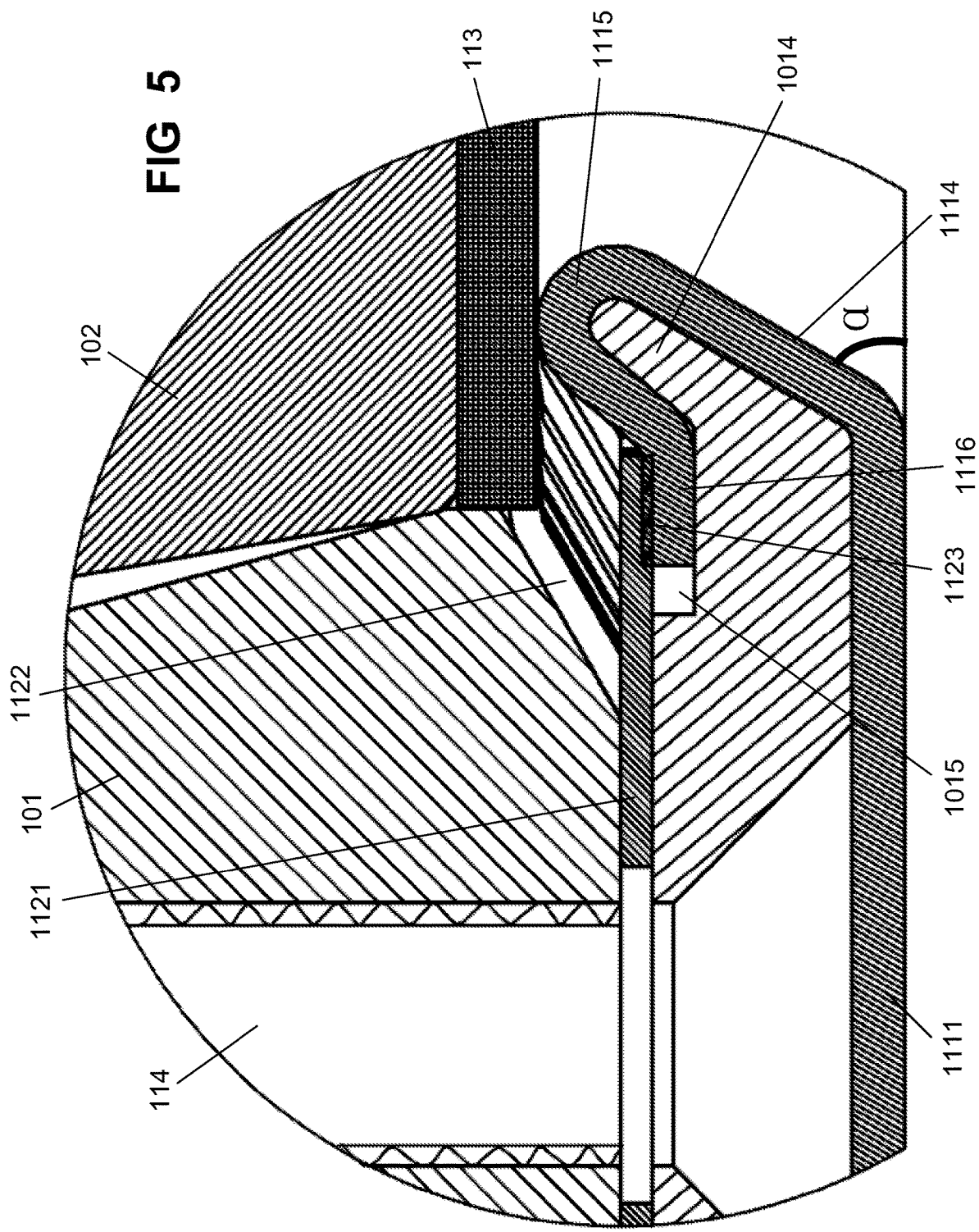
FIG. 5 is a partial enlarged view of a portion H encircled in FIG. 4.
Figure 6:
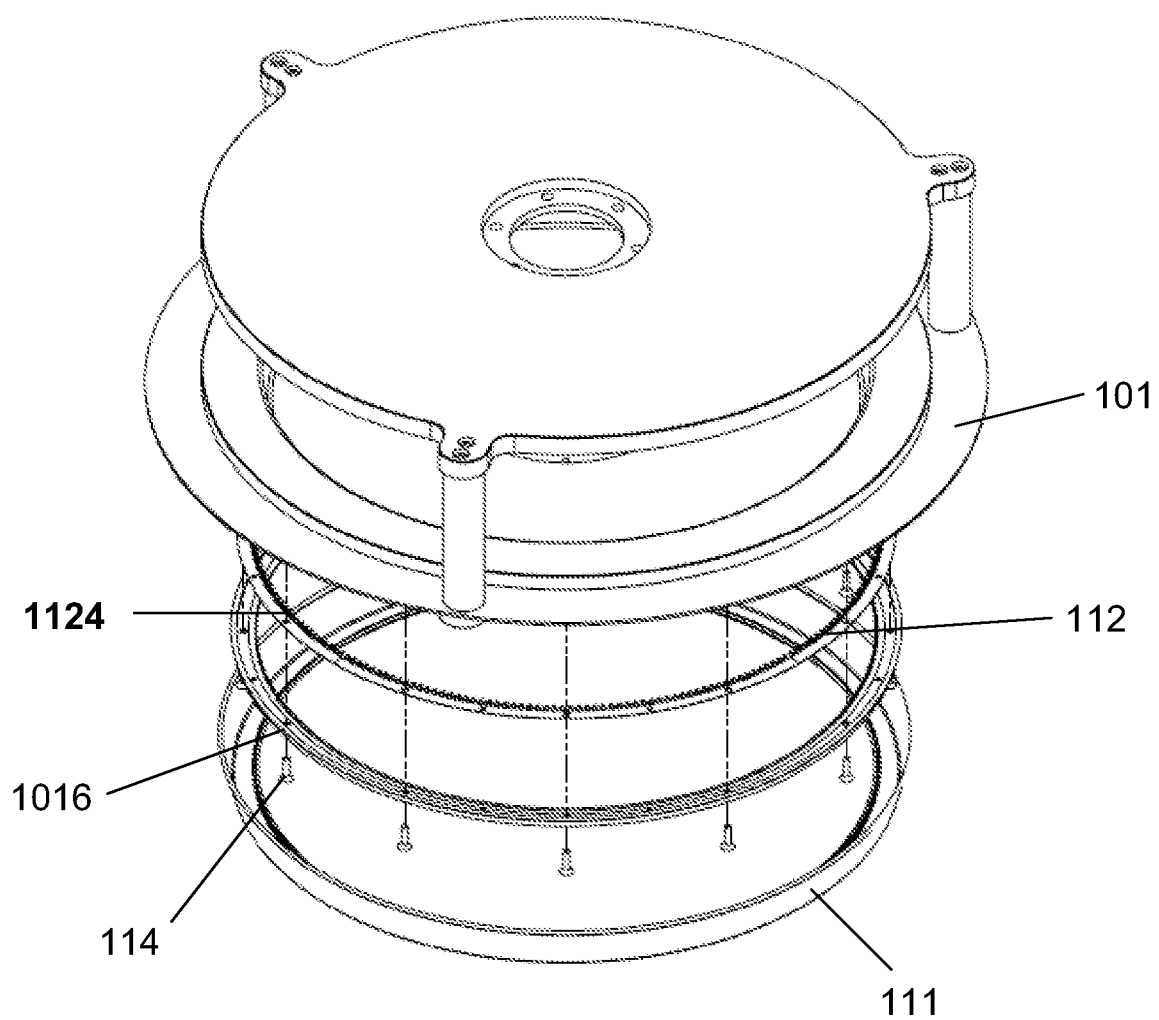
FIG. 6 is an exploded view showing a chuck cup, a contact ring and a seal shell of the apparatus.
Figure 7:
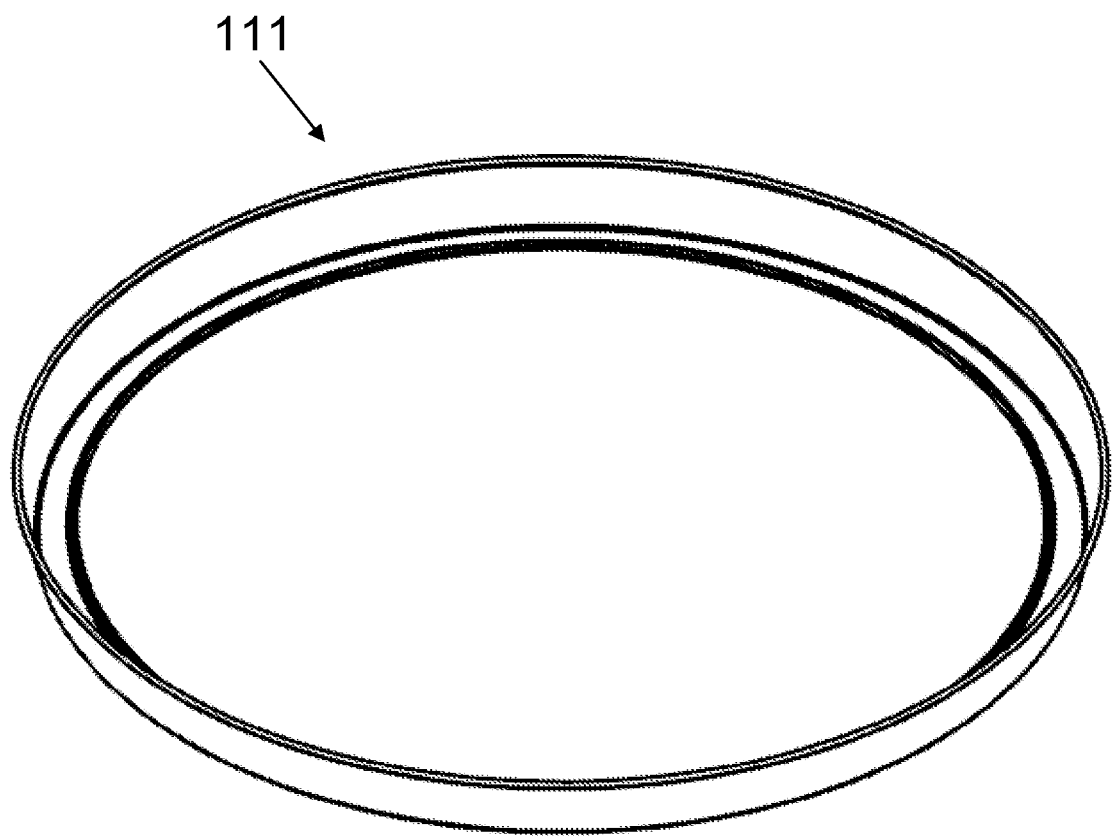
FIG. 7 is a perspective view of the seal shell of the apparatus.
Figure 8:
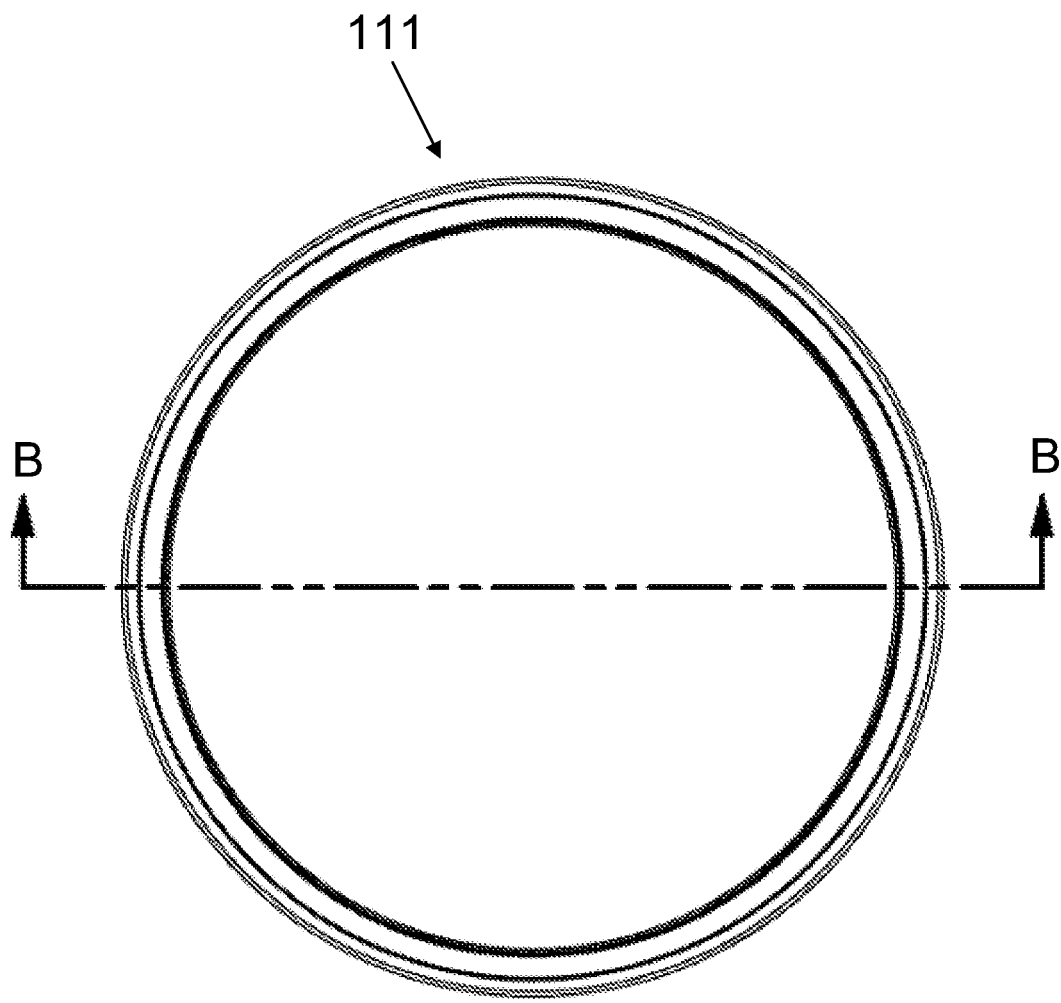
FIG. 8 is a top view of the seal shell.
Figure 9:
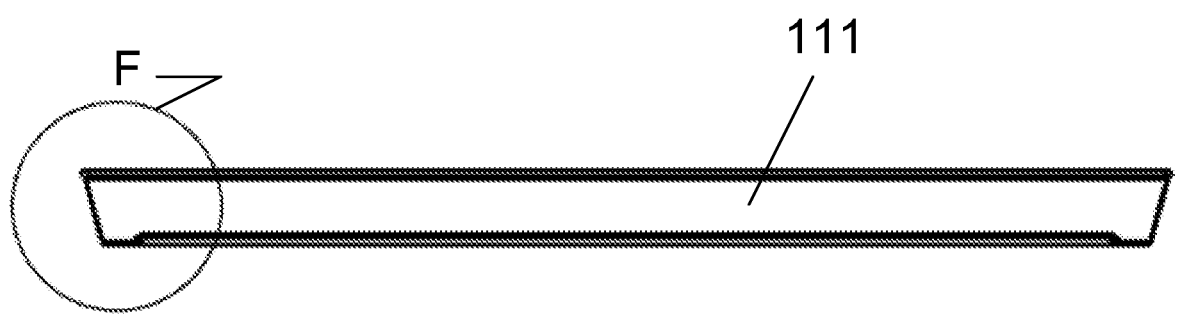
FIG. 9 is a cross-sectional view taken along line B-B of FIG. 8.
Figure 10:
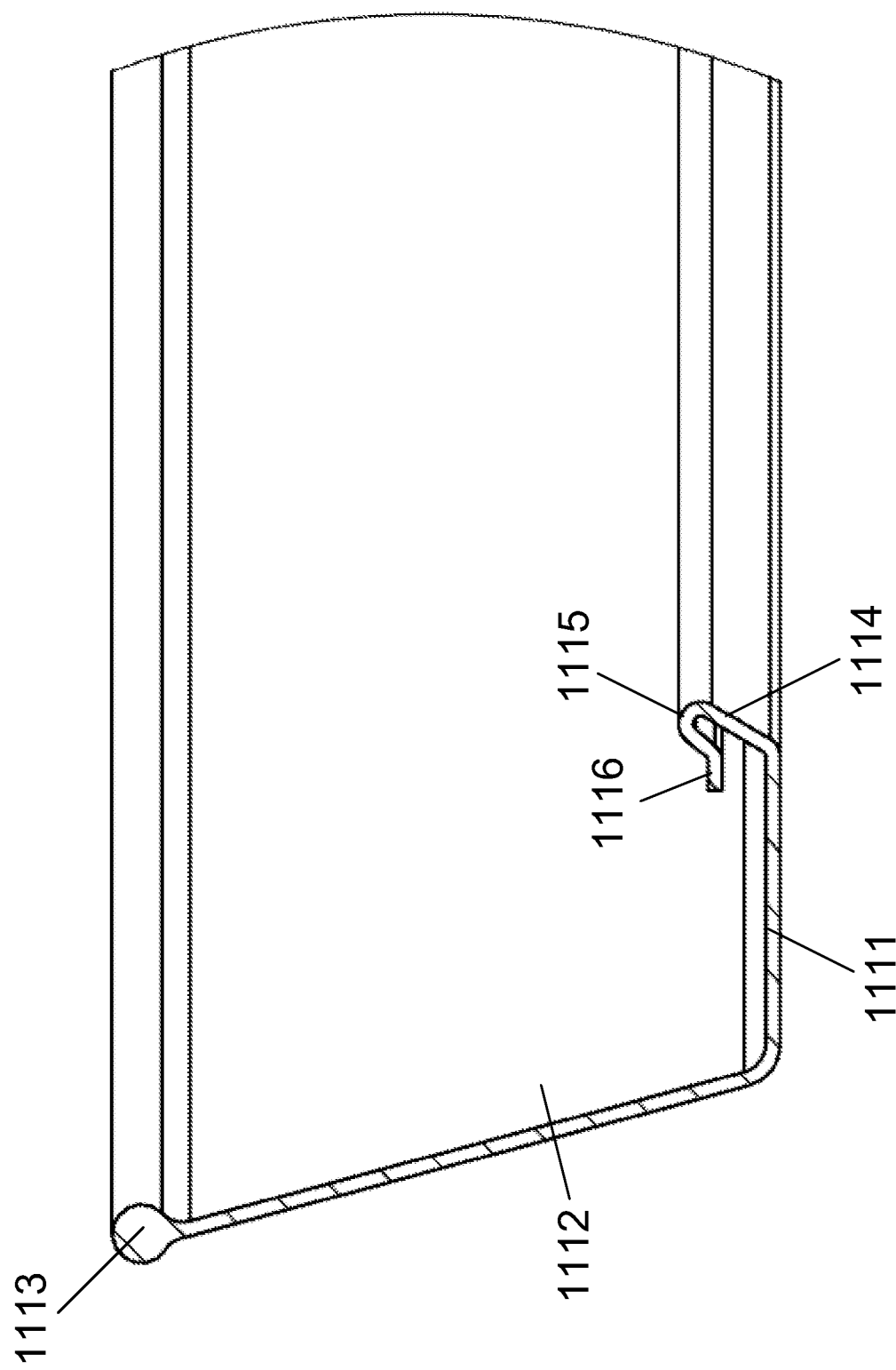
FIG. 10 is a partial enlarged view of a portion F encircled in FIG. 9.

Referring to FIG. 7 to FIG. 10, a seal shell 111 of the apparatus 100 is illustrated. The seal shell 111 has a bottom wall 1111, an outer wall 1112 and an inner wall 1114. A tip end of the outer wall 1112 has a protrusion 1113. The inner wall 1114 crooks to form a lip seal portion 1115. A tip end of the inner wall 1114 which connects to the lip seal portion 1115 horizontally extends to form a fixing portion 1116. The seal shell 111 wraps the chuck cup 101. Specifically, as shown in FIG. 4 and FIG. 5, the bottom wall 1111 of the seal shell 111 wraps the bottom surface of the base portion 1011 of the chuck cup 101. The outer wall 1112 of the seal shell 111 wraps the outer surface of the base portion 1011 of the chuck cup 101. The lip seal portion 1115 wraps the supporting portion 1014 of the chuck cup 101. The fixing portion 1116 of the seal shell 111 is located in the groove 1015 of the chuck cup 101. For fixing the seal shell 111 and the chuck cup 101 together, a fixing ring 109 is provided and disposed at the bottom of the brim 1013 of the chuck cup 101. The fixing ring 109 squeezes the protrusion 1113 of the seal shell 111 and then the fixing ring 109 is fixed at the bottom of the brim 1013 of the chuck cup 101 through a plurality of screws 110. The thickness of the seal shell 111 is 0.1 mm to 2 mm, and preferably, 0.3 mm to 1 mm. During a wet processing, the lip seal portion 1115 of the seal shell 111 seals the edge of the front side of the substrate 113 and a chemical solution cannot get to the edge of the front side of the substrate 113 and the back side of the substrate 113. Therefore, after the wet processing is completed, the edge of the front side of the substrate 113 and the back side of the substrate 113 are dry. Besides, because the seal shell 111 wraps the chuck cup 101, the seal shell 111 protects the chuck cup 101 and prevents the chuck cup 101 from contacting with the chemical solution, avoiding the chuck cup 101 eroding by the chemical solution. Because of the protection of the seal shell 111, the substrate 113 held by the apparatus 100 can be immersed into the chemical solution for process, such as, plating. The liquid level of the chemical solution is below the fixing ring 109, avoiding the chemical solution eroding the fixing ring 109 and the screws 110.

Figure 18:
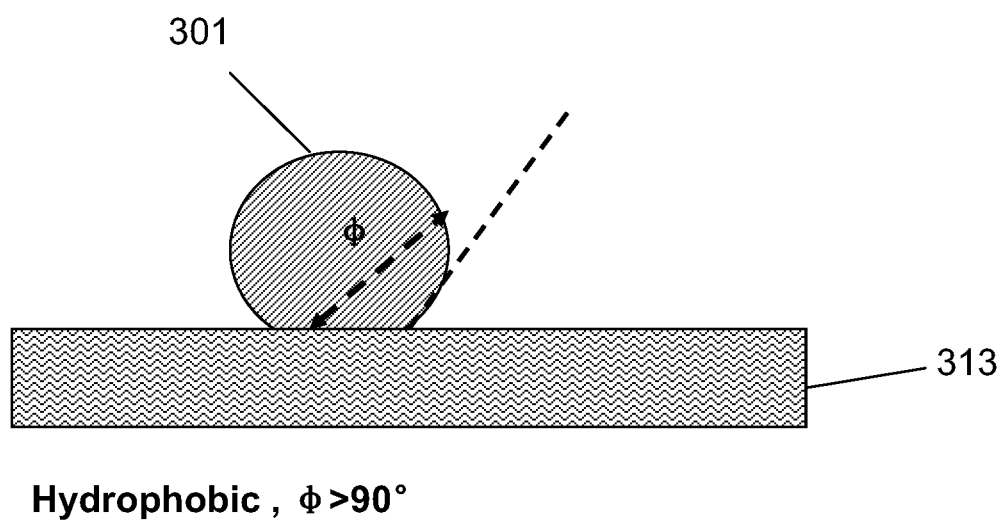
FIG. 18 shows a fundamental principle of hydrophobic.

The seal shell 111 is made by molding. The material for making the seal shell 111 is rubber, such as fluorine rubber, silicon rubber, nitrile butadiene rubber. The material for making the seal shell 111 also can be plastic, such as teflon. The material for making the seal shell 111 is soft and has a certain degree of hardness. The hardness of the material varies from 20 to 70 tested by a durometer, and preferably from 40 to 60. The material for making the seal shell 111 is hydrophobic and the material surface roughness Ra<8 μm. As shown in FIG. 18, when a contacting angle Φ between a liquid drop 301 and a substrate 313 is larger than 90°, the substrate 313 is hydrophobic. The contacting angle Φ is related to the material surface roughness. The contacting angle Φ decreases while the material surface roughness increases. If the material surface is too rough, larger than 8 μm, the seal effect will become worse. Therefore, to achieve a better seal effect, the material surface roughness is preferably less than 5 μm.

The inner wall 1114 of the seal shell 111 tilts an angle α relative to the horizontal plane. The angle α is smaller than 90°. When the substrate 113 needs to immerse into the electrolyte solution for plating, the apparatus 100 holds the substrate 113 and then the apparatus 100 moves from a load or unload position to a process position. The substrate 113 is totally immersed into the electrolyte solution. During the plating process, the apparatus 100 rotates and the rotating speed is 3 rpm to 200 rpm. During the process of immersing the substrate 113, the air can be extruded out along the inner wall 1114 of the seal shell 111. On the other hand, during the plating process, $H_2$ gas may generate on the front surface of the substrate 113. The gas bubble should be extruded out too. Otherwise, the air or gas bubble will cause void issue in the deposited metal.

Figure 11:
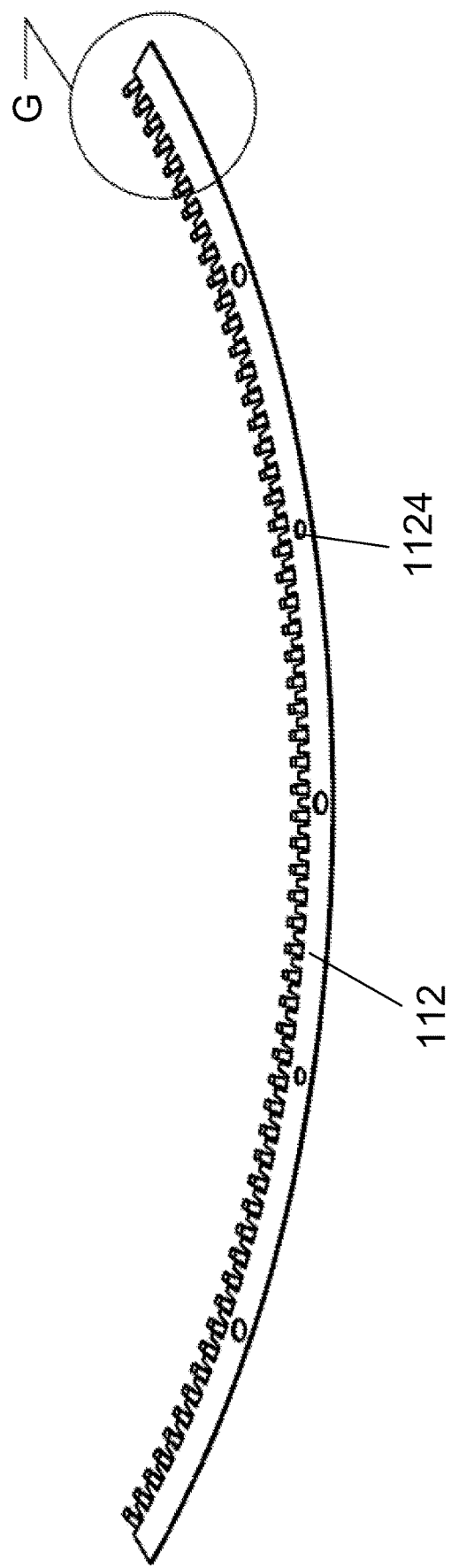
FIG. 11 is a cross-sectional view of the contact ring of the apparatus.
Figure 12:
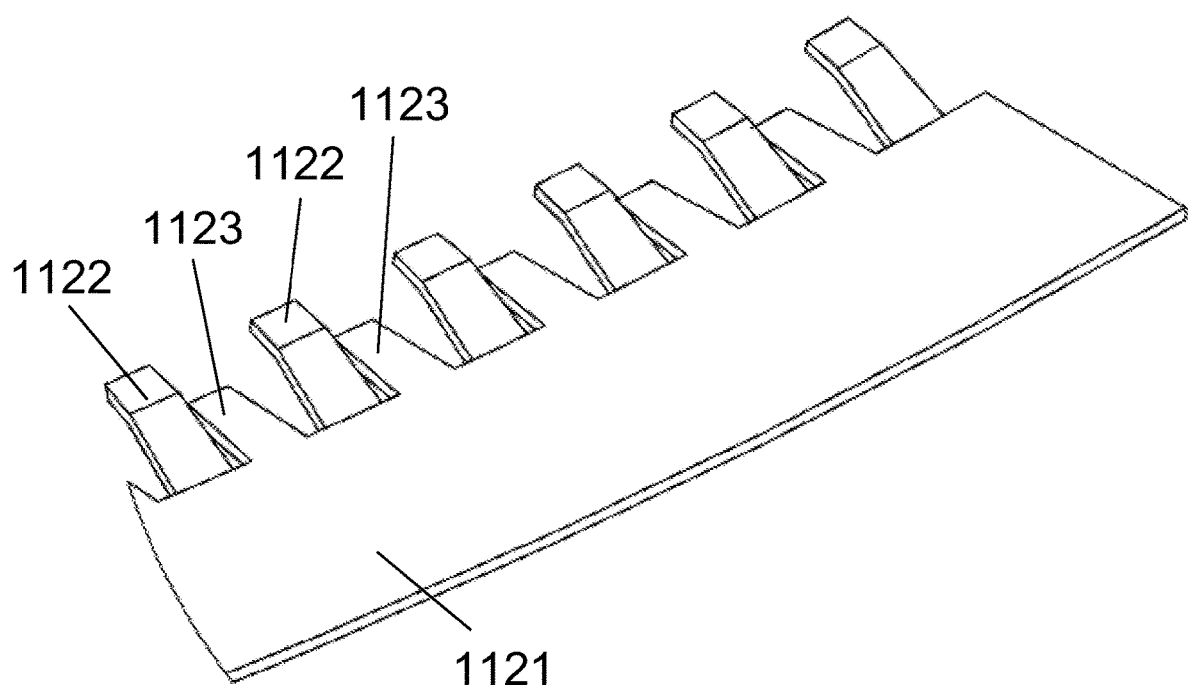
FIG. 12 is a partial enlarged view of a portion G encircled in FIG. 11.
Figure 13:
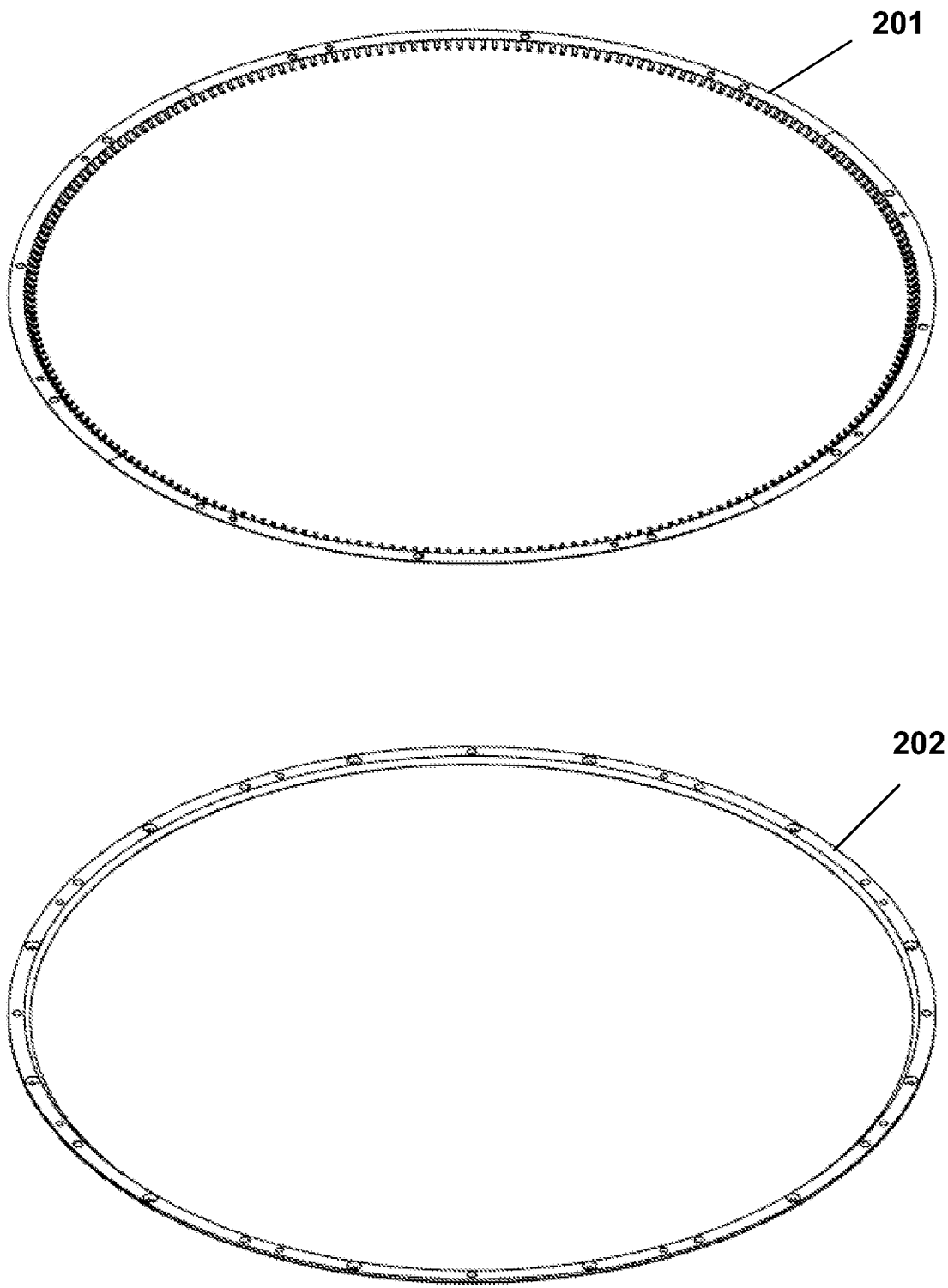
FIG. 13 is a perspective view showing a press plate and a conduct ring according to another embodiment of the present invention.
Figure 14:
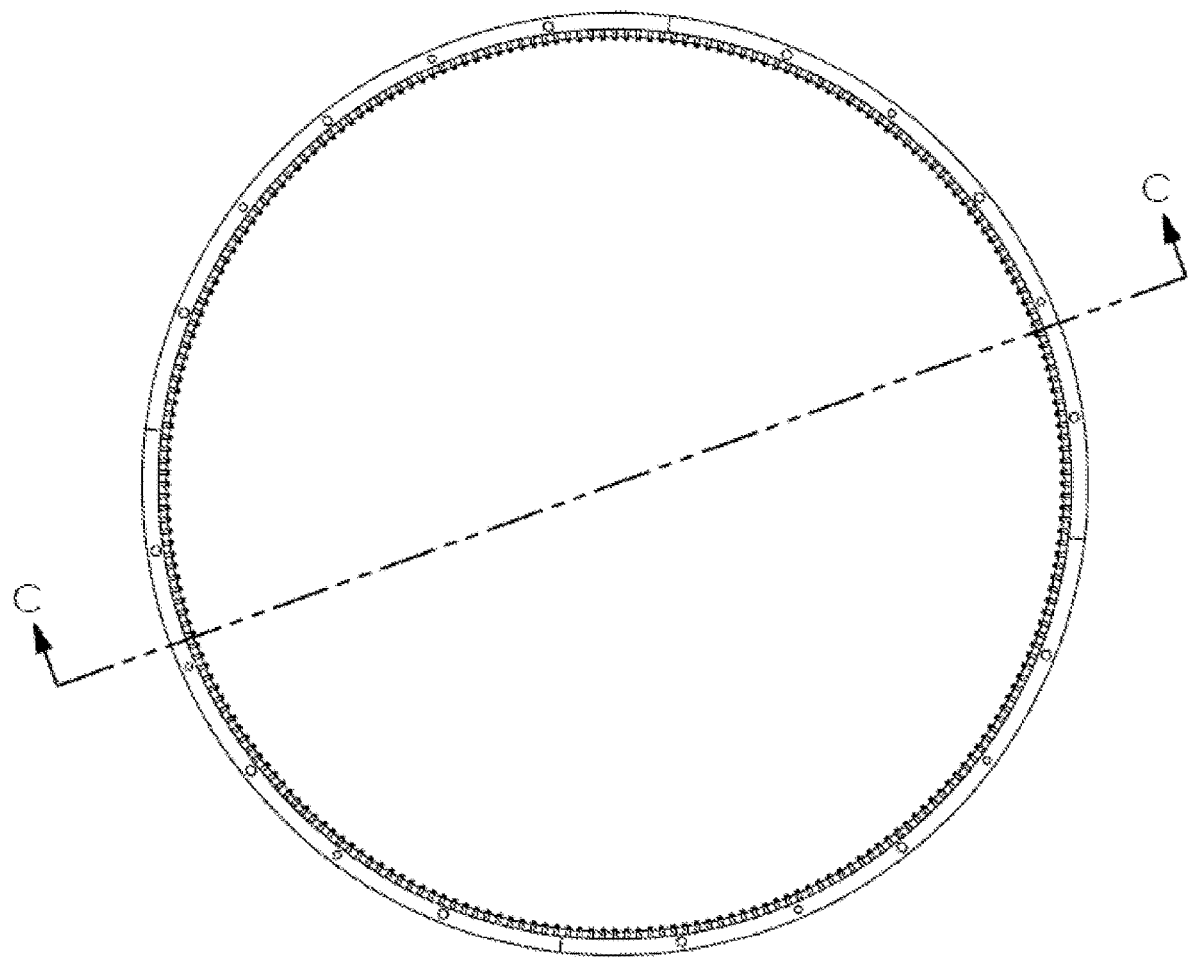
FIG. 14 is a top view showing the press plate and the conduct ring.
Figure 15:
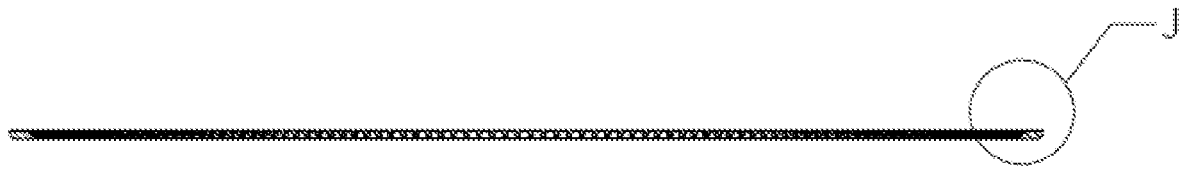
FIG. 15 is a cross-sectional view taken along line C-C of FIG. 14.
Figure 16:
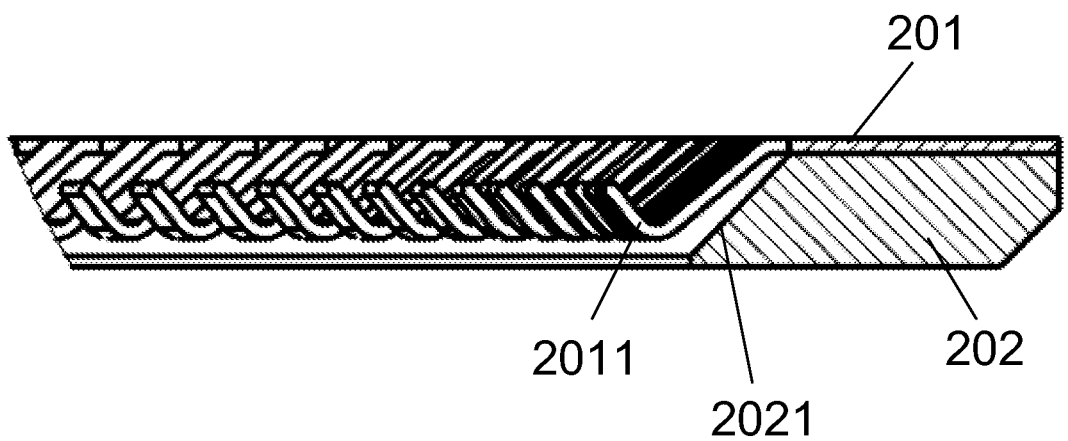
FIG. 16 is a partial enlarged view of a portion J encircled in FIG. 15.
Figure 17A:
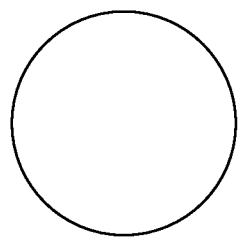
FIGS. 17a-17f show substrates with various shape.
Figure 17B:
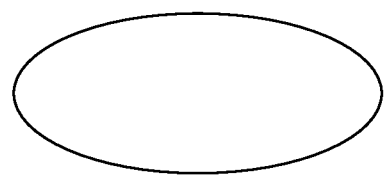
Figure 17C:
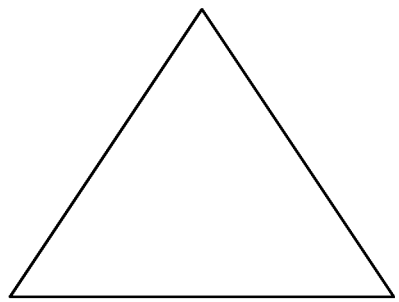
Figure 17D:
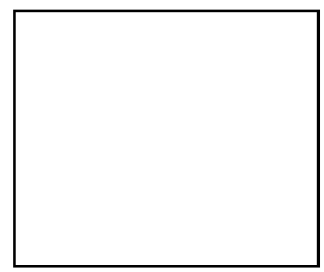
Figure 17E:
Figure 17F:
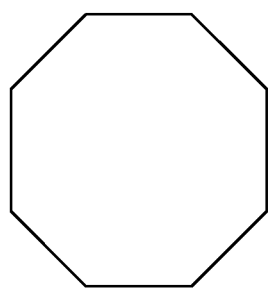

When the apparatus 100 is used for electroplating a metal layer on the front side of the substrate 113, a contact ring 112 is provided for electrical current conduction. As shown in FIG. 11 and FIG. 12, the contact ring 112 has a body portion 1121, a plurality of first finger portions 1122 and a plurality of second finger portions 1123. For mounting the contact ring 112, the lower end of the base portion 1011 of the chuck cup 101 is detachable. For clear illustration purposes, the lower end of the base portion 1011 of the chuck cup 101 is named as pedestal. The bottom surface of the pedestal defines a plurality of first screw holes 1016. The body portion 1121 of the contact ring 112 defines a plurality of second screw holes 1124. A plurality of screws 114 pass through the first screw holes 1016 and the second screw holes 1124 for fixing the body portion 1121 of the contact ring 112 and the pedestal of the chuck cup 101 together with the base portion 1011 of the chuck cup 101. The plurality of first finger portions 1122 contact with a seed layer on the edge of the front side of the substrate 113 and contact points are located in less than 2 mm distance from the edge of the substrate 113. During the electroplating process, the substrate 113 is connected with a power supply electrode and the current is conducted through the contact ring 112. The chuck cup 101 is made of conductive material for electrical current conduction. The plurality of second finger portions 1123 press against the fixing portion 1116 of the seal shell 111, which makes the fixing portion 1116 of the seal shell 111 is fixed in the groove 1015 of the chuck cup 101, avoiding the seal shell 111 falling off from the chuck cup 101. The first finger portion 1122 and the second finger portion 1123 are disposed alternatively. For a 300 mm substrate, the number of the first finger portions 1122 should be no less than 200. If the number of the first finger portions 1122 is too few, the electrical current distribution on the substrate 113 is non-uniform, which makes the deposition rate on the substrate 113 is non-uniform. The contact ring 112 is made of conductive materials, such as stainless steel, Cu, Ti, Ir, Ta, Au, Ag, Pt and alloys like that. Also the contact ring 112 can be made of stainless steel, Ti, Ta, Al and alloys with Pt coating or Au coating. Also the contact ring 112 is made of other materials with high conductivity. Preferably, the contact ring 112 is made of spring steel.

As shown in FIG. 17a to FIG. 17f, it is recognized that the shape of the substrate 113 can be circle, oval, triangle, square, rectangle, octagon, etc. And correspondingly, the chuck cup 101 and the chuck plate 102 should be designed to accommodate to the substrate 113.

For assembling the seal shell 111 and the contact ring 112, firstly, detach the pedestal from the base portion 1011 of the chuck cup 101, and then the lip seal portion 1115 of the seal shell 111 wraps the supporting portion 1014 of the chuck cup 101 and the fixing portion 1116 of the seal shell 111 is located in the groove 1015 of the chuck cup 101. A plurality of screws is used for fixing the body portion 1121 of the contact ring 112 together with the pedestal of the chuck cup 101 for making the plurality of second finger portions 1123 of the contact ring 112 press against the fixing portion 1116 of the seal shell 111 in the groove 1015 of the chuck cup 101. Secondly, the plurality of screws 114 pass through the first screw holes 1016 of the chuck cup 101 and the second screw holes 1124 of the contact ring 112 for fixing the pedestal together with the base portion 1011 of the chuck cup 101. Thirdly, the bottom wall 1111 and the outer wall 1112 of the seal shell 111 respectively wrap the bottom surface and the outer surface of the base portion 1011 of the chuck cup 101. Lastly, the fixing ring 109 is fixed at the bottom of the brim 1013 of the chuck cup 101 through the plurality of screws 110, and the fixing ring 109 squeezes the protrusion 1113 of the seal shell 111.

An electroplating process sequence by using the apparatus 100 includes steps as follow:

Step 1: the apparatus 100 moves to a load or unload position.

Step 2: the vertical driving device 103 drives the chuck plate 102 to go up.

Step 3: the substrate 113 is loaded on the lip seal portion 1115 of the seal shell 111 and the front side of the substrate 113 exposes and faces down.

Step 4: the vertical driving device 103 drives the chuck plate 102 to go down for chucking the substrate 113, the lip seal portion 1115 of the seal shell 111 seals the edge of the front side of the substrate 113 and the plurality of first finger portions 1122 of the contact ring 112 contact with a seed layer on the edge of the front side of the substrate 113.

Step 5: the angle control driving device 104 drives the chuck plate 102 and the chuck cup 101 to tilt an angle.

Step 6: the rotating driving device 106 drives the chuck plate 102 and the chuck cup 101 to rotate at a preset rotating speed and meanwhile the apparatus 100 moves to a process position at which the substrate 113 is immersed into the electrolyte solution.

Step 7: the angle control driving device 104 drives the chuck plate 102 and the chuck cup 101 to turn, making the chuck plate 102 and the chuck cup 101 stay at a vertical status.

Step 8: the electric current is turned on for electroplating a metal layer on the front side of the substrate 113.

Step 9: after the electroplating process is completed, the apparatus 100 moves to a rinse position and then rotates at a high speed, the electrolyte solution is rinsed off from the surface of the substrate 113.

Step 10: the apparatus 100 moves to the unload position, and $N_2$ gas is supplied to the back side of the substrate 113. The vertical driving device 103 drives the chuck plate 102 to go up and then the substrate 113 is taken from the lip seal portion 1115 of the seal shell 111.

As described above, the apparatus 100 of the present invention utilizes the seal shell 111 wrapping the chuck cup 101, when the apparatus 100 is used for holding the substrate 113 and immersing the substrate 113 into the electrolyte solution for plating, the seal shell 111 protects the edge of the front side of the substrate 113, the back side of the substrate 113 and the contact ring 112 inside the chuck cup 101, avoiding the edge of the front side of the substrate 113, the back side of the substrate 113 and the contact ring 112 inside the chuck cup 101 contacting with the electrolyte solution. The seal shell 111 is soft, and the chuck cup 101 is made of a material with higher degree of hardness than the seal shell 111, when the seal shell 111 wraps the chuck cup 101, the chuck cup 101 does not deform. Therefore, after chucking the substrate 113, the seal shell 111 seals the substrate surface very gently without damage to the substrate surface. The seal effect of the seal shell 111 is very good. Besides, the thickness of the seal shell 111 is thick, so the life time of the seal shell 111 is long. Moreover, after the apparatus 100 is used for a period of time, it just needs to replace the contact ring 112 and the seal shell 111, and the other parts of the apparatus 100 do not need to replace, which reduces the production cost.

Referring to FIG. 13 to FIG. 16, in another embodiment, a conduct ring 201 for electrical current conduction and a press plate 202 for fixing the seal shell 111 are provided. The function of the assembly of the conduct ring 201 and the press plate 202 is the same as the contact ring 112, so the assembly of the conduct ring 201 and the press plate 202 can replace the contact ring 112. It is recognized that if the apparatus is used for electroless plating, the conduct ring 201 is omitted. The conduct ring 201 has a plurality of finger portions 2011 which contact with the edge of the front side of the substrate 113. The press plate 202 has a slope 2021 for matching up to the finger portions 2011 of the conduct ring 201. For assembling the seal shell 111, firstly, detach the pedestal from the base portion 1011 of the chuck cup 101, and then the lip seal portion 1115 of the seal shell 111 wraps the supporting portion 1014 of the chuck cup 101 and the fixing portion 1116 of the seal shell 111 is located in the groove 1015 of the chuck cup 101. A first group of screws is used for fixing the press plate 202 together with the pedestal of the chuck cup 101 for making the press plate 202 press against the fixing portion 1116 of the seal shell 111 in the groove 1015 of the chuck cup 101. Secondly, a second group of screws is used for fixing the pedestal of the chuck cup 101, the press plate 202 and the conduct ring 201 together with the base portion 1011 of the chuck cup 101. Thirdly, the bottom wall 1111 and the outer wall 1112 of the seal shell 111 respectively wrap the bottom surface and the outer surface of the base portion 1011 of the chuck cup 101. Lastly, the fixing ring 109 is fixed at the bottom of the brim 1013 of the chuck cup 101 through the plurality of screws 110, and the fixing ring 109 squeezes the protrusion 1113 of the seal shell 111.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. An apparatus for holding a substrate, comprising:
   a chuck cup having a base portion, the base portion having a bottom surface, an outer surface and an inner surface, the outer surface opposite the inner surface and the bottom surface extending therebetween, the inner surface at a lower end of the base portion protruding obliquely upward to form a supporting portion configured for supporting an edge of a front side of a substrate;
   a seal shell disposed around the chuck cup base portion, the seal shell having a bottom wall, an outer wall and an inner wall, the inner wall forming a lip seal portion, the bottom wall of the seal shell wrapping the bottom surface of the base portion of the chuck cup, the outer wall of the seal shell wrapping the outer surface of the base portion of the chuck cup, the lip seal portion of the seal shell wrapping the supporting portion of the chuck cup and configured for sealing the edge of the front side of the substrate;
   a chuck plate; and
   a vertical driving device connecting to the chuck plate, the vertical driving device configured for driving the chuck plate to go down or up, which makes the chuck plate press against a back side of the substrate for chucking the substrate on the lip seal portion of the seal shell or leave from the back side of the substrate.

2. The apparatus according to claim 1, wherein an upper end of the base portion of the chuck cup extends outward to form a brim, a tip end of the outer wall of the seal shell has a protrusion, a fixing ring is fixed at the bottom of the brim through a plurality of screws, the fixing ring squeezes the protrusion for fixing the seal shell together with the chuck cup.

3. The apparatus according to claim 1, wherein the thickness of the seal shell is 0.1 mm to 2 mm.

4. The apparatus according to claim 3, wherein the thickness of the seal shell is 0.3 mm to 1 mm.

5. The apparatus according to claim 1, wherein the material for making the seal shell is rubber.

6. The apparatus according to claim 5, wherein the material for making the seal shell is fluorine rubber, silicon rubber, or nitrile butadiene rubber.

7. The apparatus according to claim 1, wherein the hardness of the material for making the seal shell is in the range from 20 to 70 tested by a durometer.

8. The apparatus according to claim 1, wherein the material for making the seal shell is hydrophobic.

9. The apparatus according to claim 1, wherein the inner wall of the seal shell tilts an angle a relative to the horizontal plane, the angle a is smaller than 90 degrees.

10. The apparatus according to claim 1, wherein a groove is formed at the lower end of the base portion of the chuck cup, a tip end of the inner wall of the seal shell which connects to the lip seal portion extends to form a fixing portion, and the fixing portion is located in the groove.

11. The apparatus according to claim 10, further comprising a contact ring for electrical current conduction, the contact ring having a body portion, a plurality of first finger portions and a plurality of second finger portions, the body portion fixed at the lower end of the base portion of the chuck cup, the plurality of first finger portions contacting with the edge of the front side of the substrate, the plurality of second finger portions pressing against the fixing portion of the seal shell.

12. The apparatus according to claim 11, wherein the lower end of the base portion of the chuck cup is detachable for mounting the contact ring at the lower end of the base portion, the bottom surface of the lower end of the base portion defines a plurality of first screw holes, the body portion of the contact ring defines a plurality of second screw holes, a plurality of screws pass through the first screw holes and the second screw holes for fixing the contact ring, the lower end of the base portion and the base portion together.

13. The apparatus according to claim 11, wherein the first finger portion and the second finger portion are disposed alternatively.

14. The apparatus according to claim 10, further comprising a press plate for pressing against the fixing portion of the seal shell in the groove of the chuck cup.

15. The apparatus according to claim 1, further comprising a conduct ring for electrical current conduction, the conduct ring having a plurality of finger portions which contact with the edge of the front side of the substrate.

16. The apparatus according to claim 1, wherein the surface of the chuck plate which contacts with the back side of the substrate defines a plurality of slots.

17. The apparatus according to claim 1, further comprising an O-ring disposed between the chuck plate and the chuck cup.

18. The apparatus according to claim 1, further comprising an angle control driving device, wherein the angle control driving device drives the chuck plate and the chuck cup to tilt an angle when the chuck plate and the chuck cup fix the substrate for process.

19. The apparatus according to claim 1, further comprising a rotating driving device, wherein the rotating driving device drives the chuck plate and the chuck cup to rotate when the chuck plate and the chuck cup fix the substrate for process.

20. An apparatus for holding a substrate, comprising:
a chuck cup having a base portion and a pedestal, wherein:
the base portion has a bottom surface, an outer surface, and an inner surface, the outer surface opposite the inner surface and the bottom surface extending therebetween,
the pedestal has a surface adjacent the bottom surface of the base portion, an outer surface, a bottom surface, and an inner surface, the surface adjacent opposite the bottom surface, the outer surface opposite the inner surface with the bottom surface and the surface adjacent extending therebetween, and wherein the inner surface of the pedestal protrudes obliquely upward to form a supporting portion configured for supporting an edge of a front side of a substrate;
wherein the pedestal of the chuck cup is detachable from the base portion, the bottom surface of the lower end of the base portion defines a plurality of first screw holes, the pedestal defining a plurality of second screw holes, a plurality of screws pass through the first screw holes and the second screw holes for fixing the pedestal and the base portion together; and
wherein a groove is formed at the lower end of the base portion of the chuck cup intermediate the bottom surface of the base portion and the surface adjacent;
a seal shell extending from the groove, around the supporting portion, bottom surface of the pedestal, and the outer surface of the pedestal, and terminating along the outer surface of the base portion, the seal shell having a bottom wall, an outer wall, and an inner wall, the inner wall forming a lip seal portion, the bottom wall of the seal shell wrapping the bottom surface of the pedestal, the outer wall of the seal shell wrapping the outer surface of the pedestal and the outer surface of the base portion, the lip seal portion of the seal shell wrapping the supporting portion of the chuck cup and configured for sealing the edge of the front side of the substrate, and wherein a tip end of the inner wall of the seal shell which connects to the lip seal portion extends to form a fixing portion disposed in the groove.

* * * * *